United States Patent
Chang et al.

(10) Patent No.: US 8,138,834 B2
(45) Date of Patent: Mar. 20, 2012

(54) CURRENT CONTROL CIRCUIT, CLASS AB OPERATIONAL AMPLIFIER SYSTEM AND CURRENT CONTROL METHOD

(75) Inventors: Ming-Hung Chang, Hsinchu County (TW); Che-Hung Lin, Chiayi (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 12/895,830

(22) Filed: Sep. 30, 2010

(65) Prior Publication Data

US 2012/0013400 A1    Jan. 19, 2012

(30) Foreign Application Priority Data

Jul. 14, 2010   (TW) ................................ 99123149 A

(51) Int. Cl.
 *H03F 3/45* (2006.01)
(52) U.S. Cl. ........................................ 330/259; 330/261

(58) Field of Classification Search .................. 330/259, 330/285, 296, 261
See application file for complete search history.

(56) References Cited

U.S. PATENT DOCUMENTS

| | | | | |
|---|---|---|---|---|
| 3,434,069 | A * | 3/1969 | Jones ............................. | 330/259 |
| 3,831,113 | A * | 8/1974 | Ahmed ......................... | 331/111 |
| 4,234,853 | A * | 11/1980 | Yamaguchi ................... | 330/280 |
| 5,276,405 | A * | 1/1994 | Mazzucco et al. ............ | 330/257 |
| 6,798,291 | B2 * | 9/2004 | Veillette ....................... | 330/254 |
| 7,180,369 | B1 * | 2/2007 | Cui et al. ..................... | 330/252 |
| 7,642,852 | B2 * | 1/2010 | Chandra et al. ............... | 330/258 |
| 7,719,361 | B2 * | 5/2010 | Pera .............................. | 330/260 |

* cited by examiner

*Primary Examiner* — Henry Choe
(74) *Attorney, Agent, or Firm* — Winston Hsu; Scott Margo

(57) ABSTRACT

A current control circuit for controlling a bias current of a class AB operational amplifier includes: a low current source, for generating a low bias current; a high current source, for generating a high bias current, which is greater than the low bias current; and a comparing and selecting unit, coupled to an output terminal of the class AB operational amplifier, for selecting one of the low bias current and the high bias current to output as the bias current according to an output voltage of the class AB OP.

10 Claims, 9 Drawing Sheets

CURRENT CONTROL CIRCUIT, CLASS AB OPERATIONAL AMPLIFIER SYSTEM AND CURRENT CONTROL METHOD

BACKGROUND OF THE INVENTION

1. Field of the Invention

The present invention relates to a current control circuit, class AB operational amplifier (OP) system and current control method, and more particularly, to a current control circuit, class AB OP system and current control method capable of determining an operating status according to an output voltage, to switch a bias current.

2. Description of the Prior Art

An output stage quiescent current relates to an output stage current when no signal is inputted into an operational amplifier, and is generally maintained at a specific multiple of a bias current. For an example of this, please refer to FIG. 1, which is a schematic diagram of a class AB operational amplifier 10 in the prior art. The class AB OP 10 includes input terminals Vin−, Vin+, an output stage 9, transistors M9~M16 and current sources 102, 104. The M15, M16 transistors relate to an output stage with an output stage quiescent current IQ. The current sources 102, 104 provide bias currents IB2, IB3, respectively. In short, a sum of a gate-to-source voltage Vgs11 of the transistor M11 and a gate-to-source voltage Vgs12 of the transistor M12 is equal to a sum of the gate-to-source voltage Vgs15 of the transistor M15 and a gate-to-source voltage Vgs9 of the transistor M9, i.e. Vgs11+Vgs12=Vgs9+Vgs15. Therefore, by matching the transistors M9, M12 to make the gate-to-source voltage Vgs12 equal to the gate-to-source voltage Vgs9, i.e. Vgs12=Vgs9, the gate-to-source voltage Vgs11 can be equal to the gate-to-source voltage Vgs15, i.e. Vgs11=Vgs15. A current Id of a transistor is generally expressed as follows:

$$Id = \frac{1}{2}\mu_n Cox \frac{W}{L}(Vgs - V_T)^2(1 + \lambda Vds), \quad (\text{Eq. 1})$$

Eq. 1 can be rewritten as follows:

$$Vgs = V_T + \sqrt{\frac{2Id}{\mu_n Cox \frac{W}{L}(1 + \lambda Vds)}}, \quad (\text{Eq. 2})$$

Since the gate-to-source voltage Vgs11 is equal to the gate-to-source voltage Vgs15, a relation between the output stage quiescent current IQ and the bias current IB2 can be expressed as follows:

$$\sqrt{\frac{IQ}{\left(\frac{W}{L}\right)_{15}(1+\lambda Vds15)}} = \sqrt{\frac{IB2}{\left(\frac{W}{L}\right)_{11}(1+\lambda Vds11)}}, \quad (\text{Eq. 3})$$

Eq. 3 can be rewritten as follows:

$$IQ = \frac{\left(\frac{W}{L}\right)_{15}(1+\lambda Vds15)}{\left(\frac{W}{L}\right)_{11}(1+\lambda Vds11)} IB2, \quad (\text{Eq. 4})$$

As can be seen from Eq. 4, if no signal is inputted into the input terminals Vin−, Vin+, i.e. a quiescent operating status, a ratio of the output stage quiescent current IQ to the bias current IB2 is substantially equal to a ratio of a W/L ratio (W/L)$_{15}$ of the transistor M15 to a W/L ratio (W/L)$_{11}$ of the transistor M11, i.e. the output stage quiescent current IQ is proportional to the bias current IB2.

However, in practical operations, if a lower bias current IB2 is applied for reducing power consumption of the class AB OP 10 in the quiescent operating status, efficiency of the class AB OP 10 in a dynamic operating status (signals are inputted into the input terminals Vin−, Vin+) is also reduced; and if a higher bias current IB2 is applied for enhancing the efficiency of the class AB OP 10 in the dynamic operating status, the power consumption of the class AB OP 10 in the quiescent operating status is also increased. Thus, there is a need for improvement of the prior art.

SUMMARY OF THE INVENTION

It is therefore an objective of the present invention to provide a current control circuit, class AB OP system and current control method.

The present invention discloses a current control circuit for controlling a bias current of a class AB OP. The current control circuit includes: a low bias current source, for generating a low bias current; a high bias current source, for generating a high bias current greater than the low bias current; and a comparing and selecting unit, coupled to an output terminal of the class AB OP, for selecting one of the low bias current and the high bias current to output as the bias current according to an output voltage of the class AB OP.

The present invention further discloses a class AB OP system. The class AB OP system includes a plurality of class AB OPs, each for generating an output voltage; and a current control circuit, for controlling a bias current of each of the plurality of class AB OPs.

The present invention further discloses a current control method for controlling a bias current of a class AB OP. The current control method includes steps of providing a low bias current and a high bias current, wherein the high bias current is greater than the low bias current; and selecting one of the low bias current and the high bias current to output as the bias current according to an output voltage of the class AB OP.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
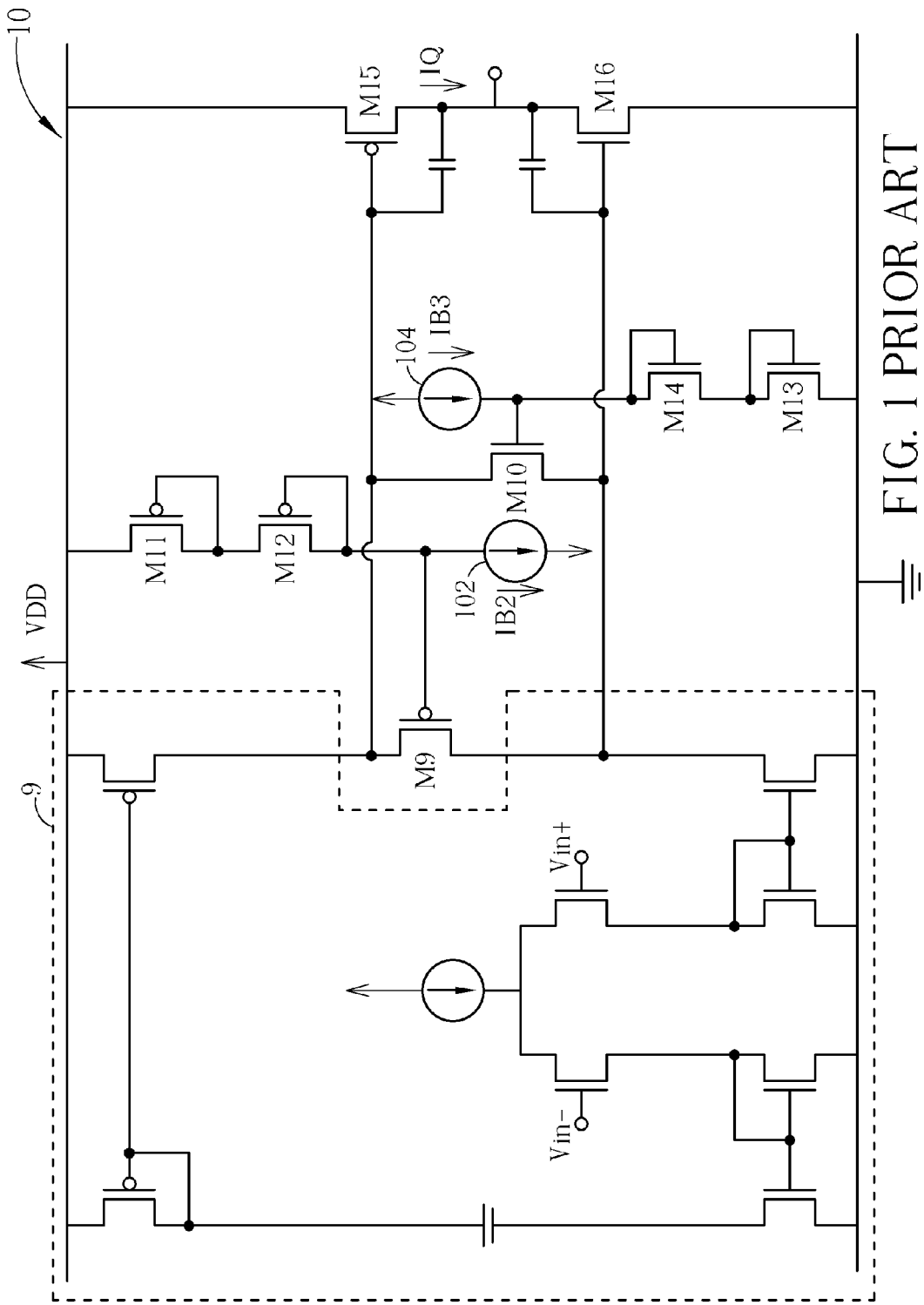
FIG. 1 is a schematic diagram of a class AB operational amplifier in the prior art.
Figure 2:
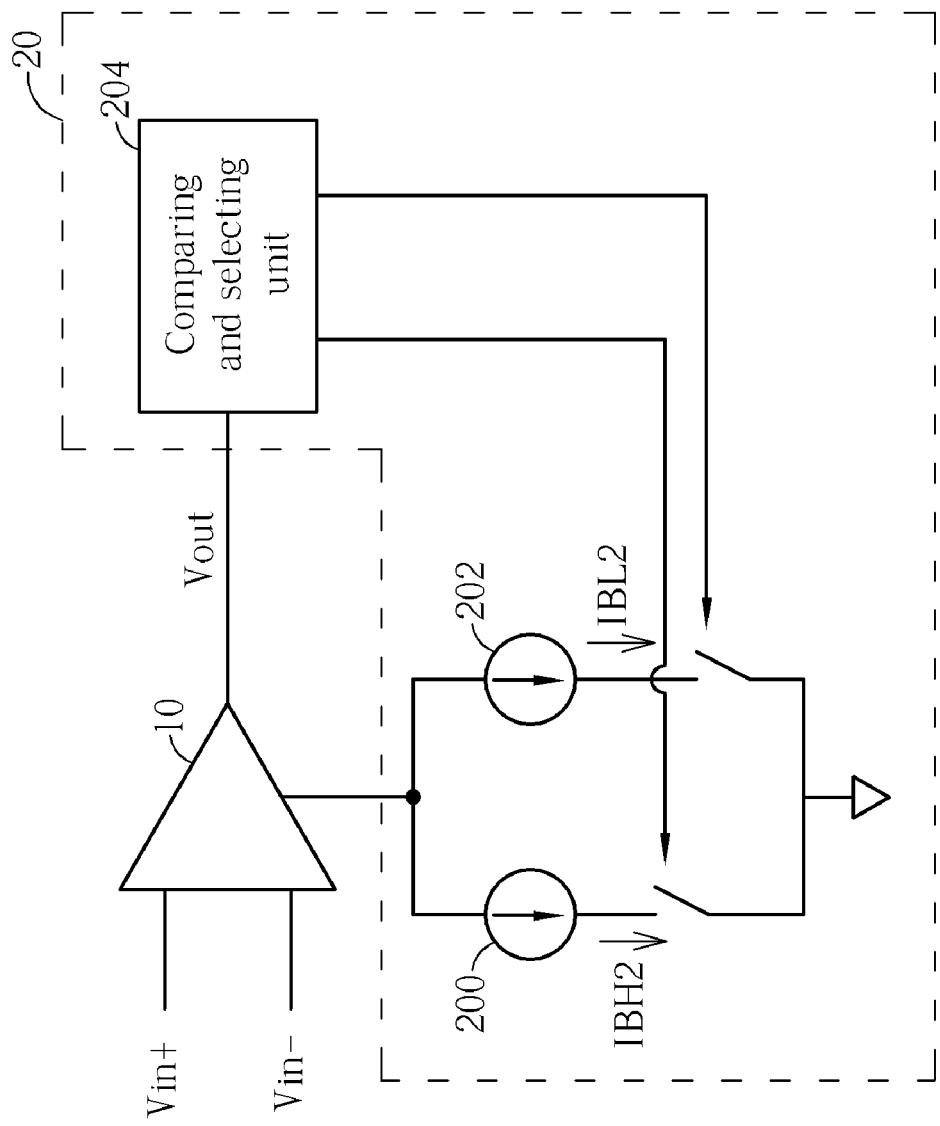
FIG. 2 is a schematic diagram of a current control circuit according to an embodiment of the present invention.

Please refer to FIG. 2, which is a schematic diagram of a current control circuit 20 according to an embodiment of the present invention. The current control circuit 20 includes current sources 200, 202 and a comparing and selecting unit 204. For clear illustration, the current control circuit 20 shown in FIG. 2 simplifies structure of the class AB OP 10 shown in FIG. 1, wherein the current source 102 of the class AB OP 10 is replaced either by the current source 200 or 202. In short, the current sources 200, 202 generate a high bias current IBH2 and a low bias current IBL2, respectively, wherein the high bias current IBH2 is greater than the low bias current IBL2. The comparing and selecting unit 204 determines whether signals are inputted into the input terminals Vin−, Vin+ according to an output voltage Vout of the class AB OP 10. Then, the comparing and selecting unit 204 replaces the conventional bias current IB2 with the high bias current IBH2 if signals are inputted into the input terminals Vin−, Vin+, i.e. the dynamic operating status, while replacing the conventional bias current IB2 with the low bias current IBL2 if no signal is inputted into the input terminals Vin−, Vin+ i.e. the quiescent operating status. As a result, the current control circuit 20 can control the class AB OP 10 to apply a higher high bias current IBH2 in the dynamic operating status, so as to enhance efficiency and reduce nonlinear distortion, while applying a lower low bias current IBL2 in the quiescent operating status, so as to reduce power consumption.

Figure 3:
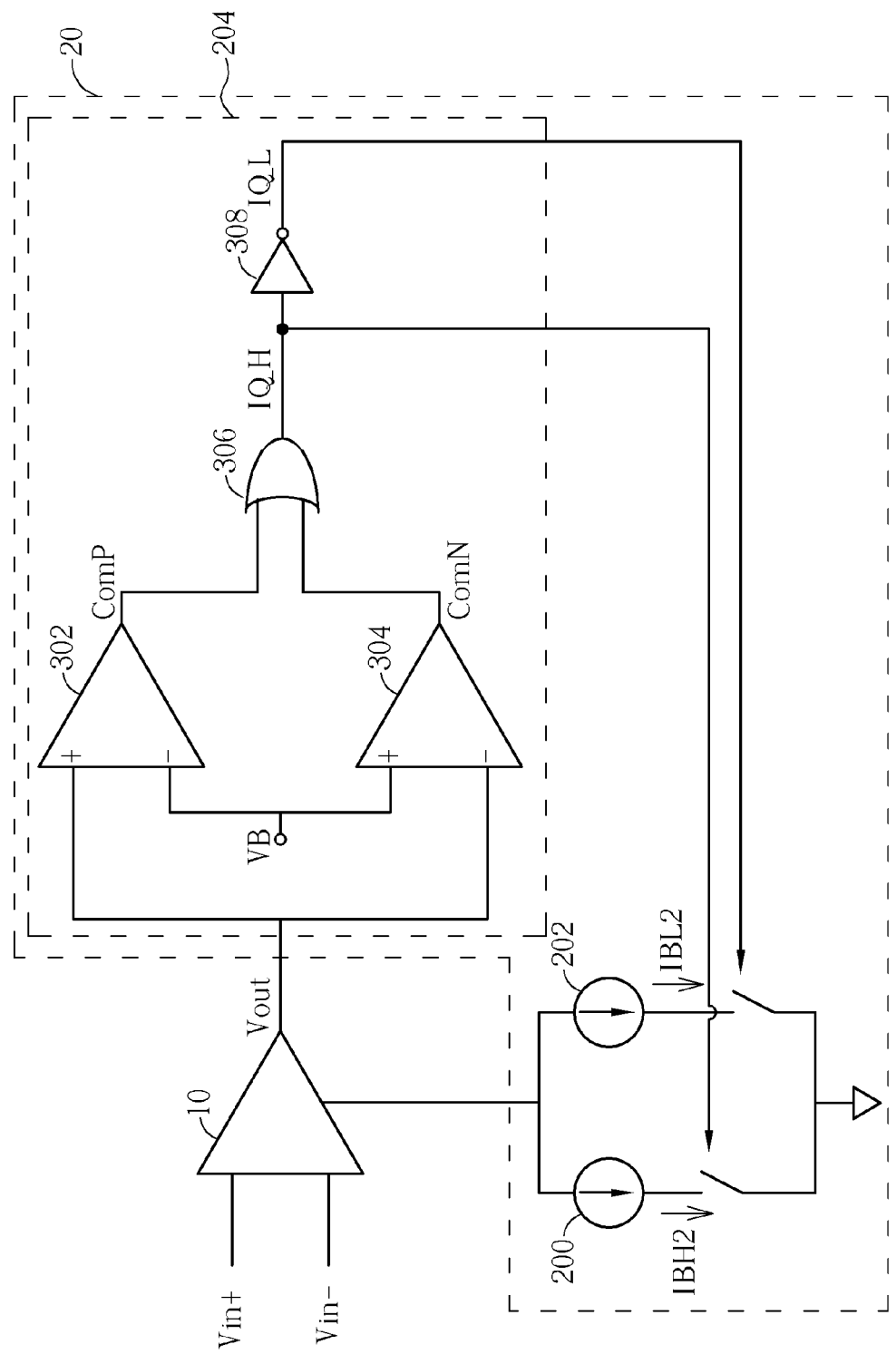
FIG. 3 is a schematic diagram of a comparing and selecting unit shown in FIG. 2.

Please refer to FIG. 3, which is a schematic diagram of the comparing and selecting unit 204 shown in FIG. 2. The comparing and selecting unit 204 includes a positive comparator 302, a negative comparator 304, an OR gate 306 and an inverter 308. In short, the output voltage Vout of the class AB OP 10 in the quiescent operating status is half a system voltage VDD, and thus the comparing and selecting unit 204 compares the output voltage Vout with a quiescent voltage VB, which is half the system voltage VDD, to determine the operating status of the class AB OP 10. Additionally, since the output voltage Vout of the class AB OP 10 in the dynamic operating status is greater or less than the quiescent voltage VB, the comparing and selecting unit 204 determines that the class AB OP 10 is in the dynamic operating status and then replaces the conventional bias current IB2 with the high bias current IBH2 if an absolute value of a voltage difference between the output voltage Vout and the quiescent voltage VB is greater than a specific value SV, which is properly set for preventing false determination due to process variation; and the comparing and selecting unit 204 determines that the class AB OP 10 is in the quiescent operating status and then replaces the conventional bias current IB with the low bias current IBL2 if the absolute value of the voltage difference between the output voltage Vout and the quiescent voltage VB is less than the specific value SV.

In detail, if the absolute value of the voltage difference between the output voltage Vout and the quiescent voltage VB is greater than the specific value SV, a positive comparing result ComP of the positive comparator 302 indicates the output voltage Vout minus the quiescent voltage VB is greater than the specific value SV or a negative comparing result ComN of the negative comparator 304 indicates the quiescent voltage VB minus the output voltage Vout is greater than the specific value SV, such that a high bias current signal IQ_H generated by the OR gate 306 replaces the conventional bias current IB2 with the high bias current IBH2. If the absolute value of the voltage difference between the output voltage Vout and the quiescent voltage VB is less than the specific value SV, the positive comparing result ComP indicates the output voltage Vout minus the quiescent voltage VB is less than the specific value SV and the negative comparing result ComN indicates the quiescent voltage VB minus the output voltage Vout is less than the specific value SV, such that a low bias current signal IQ_L generated by the inverter 308 replaces the conventional bias current IB2 with the low bias current IBL2. As a result, the class AB OP 10 can apply the higher high bias current IBH2 in the dynamic operating status, and apply the lower low bias current IBL2 in the quiescent operating status.

Figure 4A:
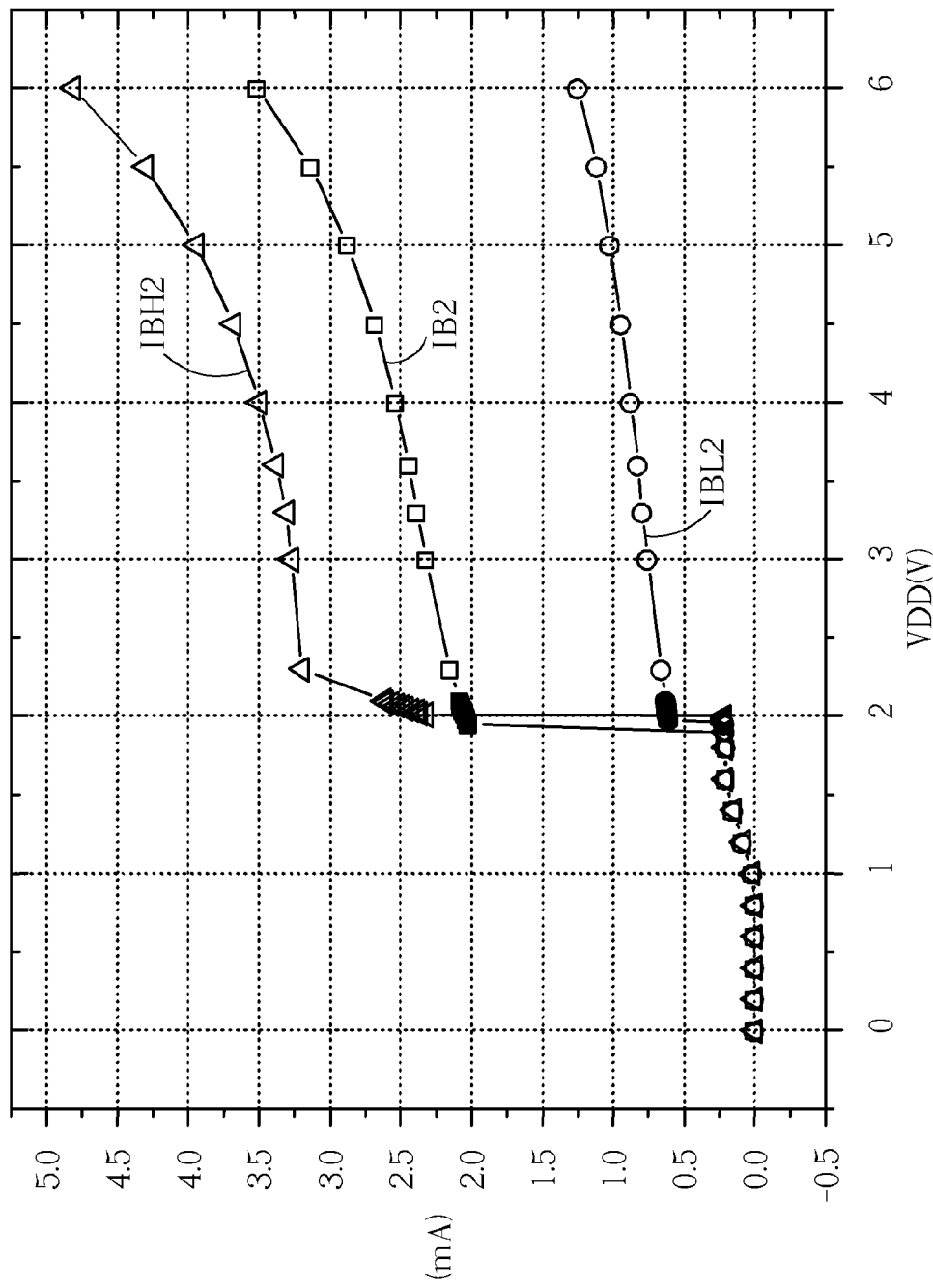
FIG. 4A is a schematic diagram of the output stage quiescent current under different system voltages when the class AB OP shown in FIG. 1 applies a high bias current and a low bias current shown in FIG. 2, and a bias current shown in FIG. 1, respectively.
Figure 4B:
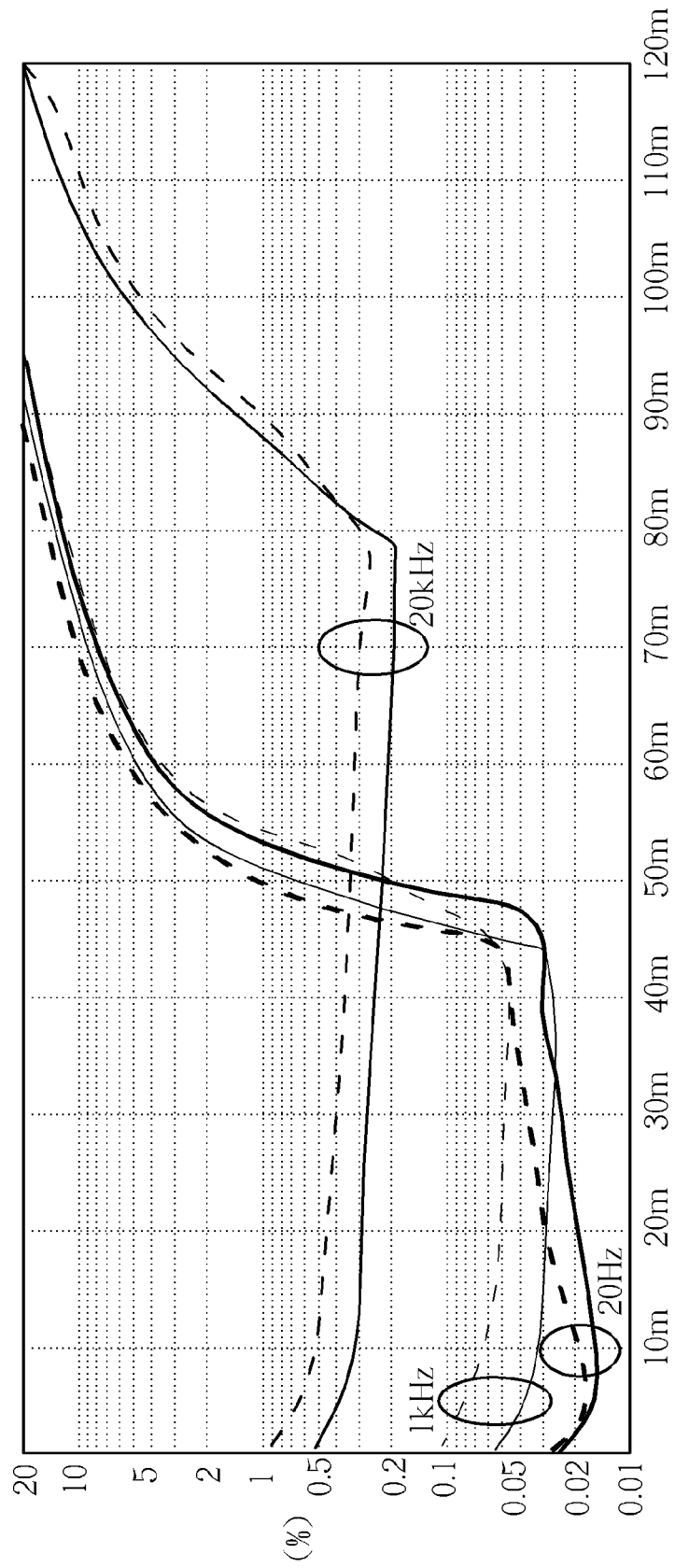
FIG. 4B is a schematic diagram of total harmonic distortion plus noise of the class AB OP shown in FIG. 1 under different operating power when the class AB OP shown in FIG. 1 optionally including the current control circuit shown in FIG. 2 is dynamically operated at 20 Hz, 1 kHz and 20 kHz, respectively.

For illustrating the improved effect of the current control circuit 20, please refer to FIG. 4A and FIG. 4B. FIG. 4A is a schematic diagram of the output stage quiescent current IQ, i.e. output current, under different system voltages VDD when the class AB OP 10 applies the high bias current IBH2, the bias current IB2 and the low bias current IBL2, respectively. FIG. 4B is a schematic diagram of total harmonic distortion plus noise (THD+N) of the class AB OP 10 under different operating power when the class AB OP 10 optionally including the current control circuit 20 is dynamically operated at 20 Hz, 1 kHz and 20 kHz, respectively, wherein dotted lines denote the class AB OP 10 not including the current control circuit 20, and solid lines denote the class AB OP 10 including the current control circuit 20. THD relates to distortion of signals at intended frequency, i.e. fundamental component, due to interference resulting from signals at multiple of intended frequency, i.e. harmonic component. THD plus ordinary noise interference is THD+N; in general, the lower this number is, the better.

As can be seen from FIG. 4A, the current control circuit 20 can control the class AB OP 10 to have the higher output stage quiescent current IQ, i.e. output current, in the dynamic operating status, so as to enhance efficiency, and have the lower output stage quiescent current IQ in the quiescent operating status, so as to reduce power consumption. As can be seen from FIG. 4B, THD+N of the class AB OP 10 including the current control circuit 20, i.e. the solid lines, is lower than that of the class AB OP 10 not including the current control circuit 20, i.e. the dotted lines, when the class AB OP 10 is dynamically operated at 20 Hz, 1 kHz and 20 kHz. Therefore, the current control circuit 20 can reduce nonlinear distortion and provide better characteristics.

Figure 5:
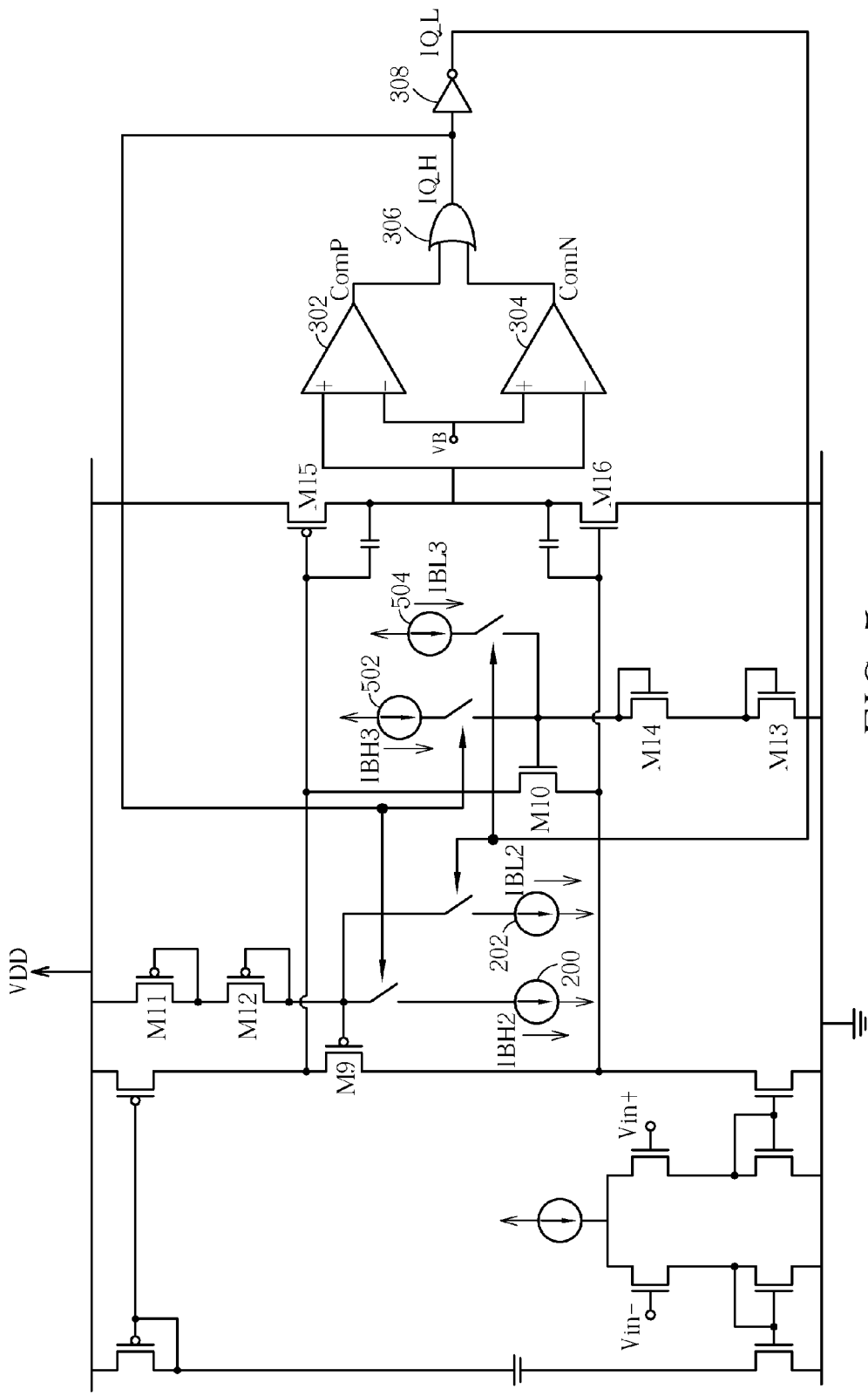
FIG. 5 is a detailed schematic diagram of the comparing and selecting unit shown in FIG. 3.

Noticeably, the spirit of the present invention is that the current control circuit 20 can control the class AB OP 10 to apply the higher high bias current IBH2 in the dynamic operating status, and to apply the lower low bias current IBL2 in the quiescent operating status. Those skilled in the art should make modifications or alterations accordingly. For example, realization of the current control circuit 20 is not limited to the circuit shown in FIG. 3, as long as functions of the current control circuit 20 can be achieved. In addition, please refer to FIG. 5, which is a detailed schematic diagram of the comparing and selecting unit 204 shown in FIG. 3, where operations thereof are the same as the comparing and selecting unit 204 shown in FIG. 3, and therefore further detail is not narrated hereinafter for brevity. Noticeably, all of the transistors M9, M11, M12, M15 of the embodiment of the present invention are P-type metal oxide semiconductor (PMOS) transistors. An embodiment of the present invention can also be realized by NMOS transistors M10, M13, M14, M16 and corresponding current sources 502, 504 and the comparing and selecting unit 204. As this modification can be understood by referring to the above description, it is therefore not detailed hereinafter.

Figure 6A:
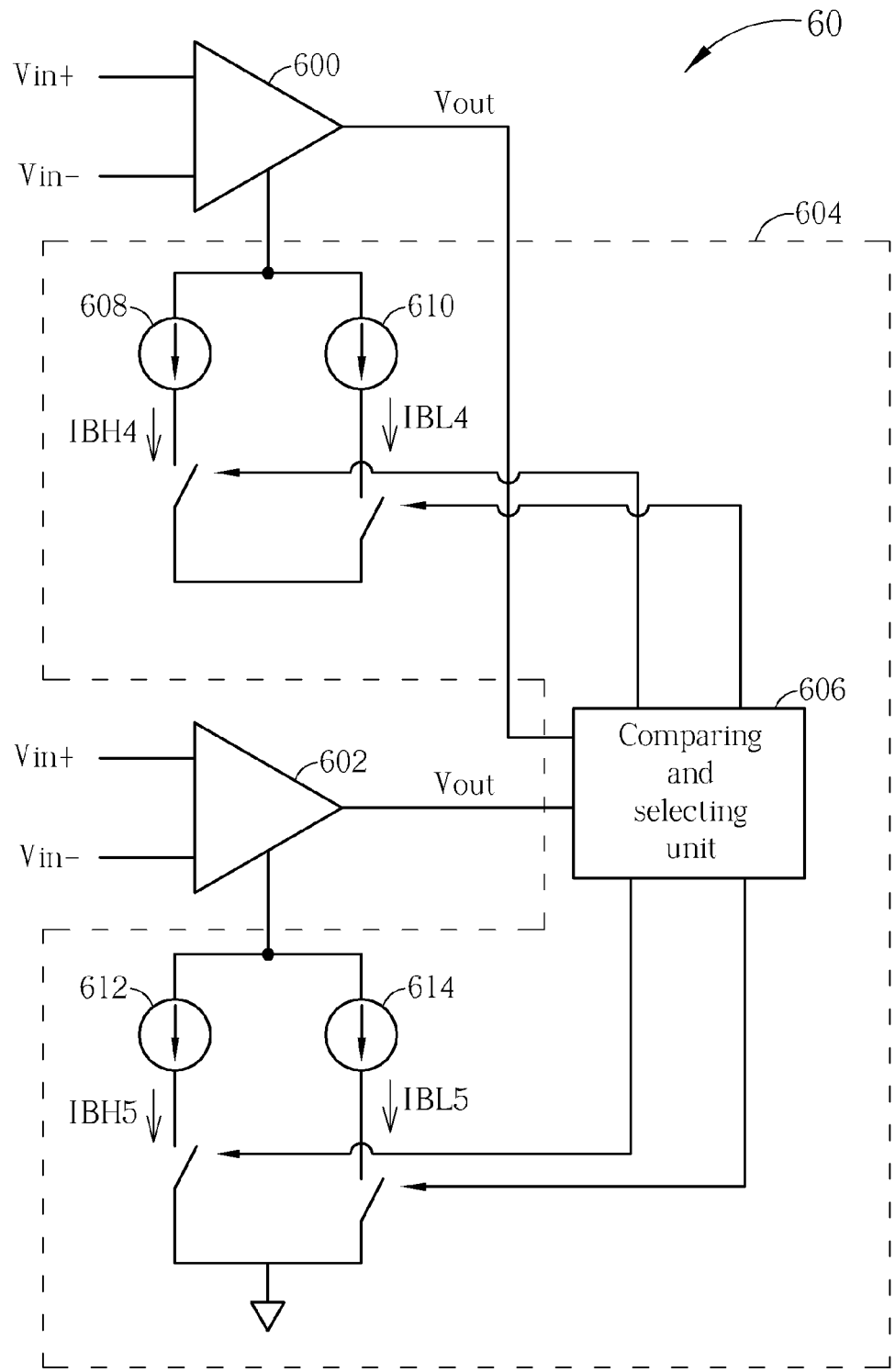
FIG. 6A is a schematic diagram of a class AB OP system according to an embodiment of the present invention.
Figure 6B:
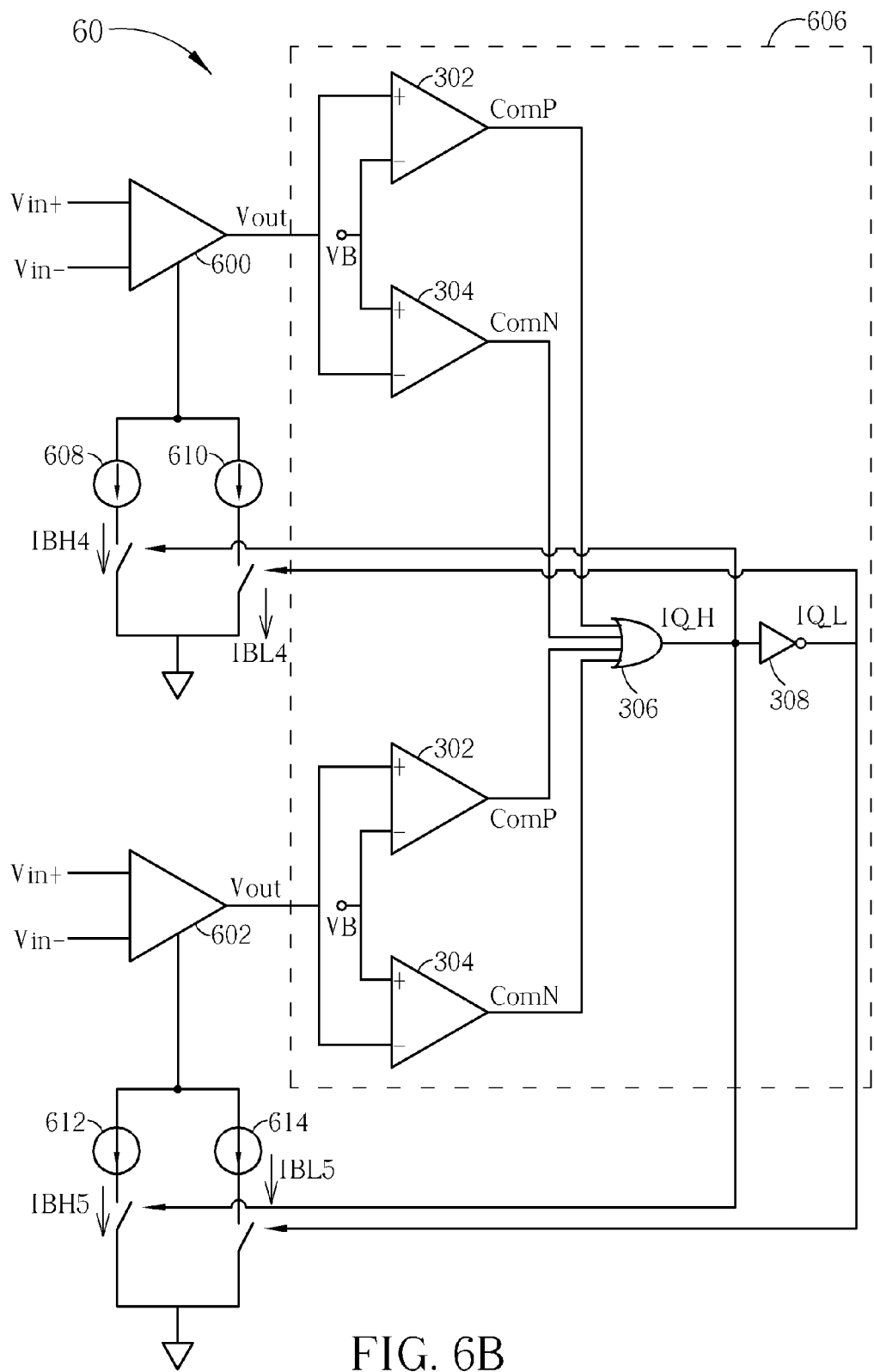
FIG. 6B is a schematic diagram of a comparing and selecting unit shown in FIG. 6A.

Please refer to FIG. 6A, which is a schematic diagram of a class AB OP system 60 according to an embodiment of the present invention. The class AB OP system 60 includes class AB OPs 600, 602 and a current control circuit 604. The current control circuit 604 includes a comparing and selecting unit 606 and current sources 608, 610, 612, 614. Operations of the current control circuit 604 are similar to those of the current control circuit 20. Differences between the current control circuit 604 and the current control circuit 20 are that the current control circuit 604 controls high bias currents IBH4, IBH5 as bias currents of the class AB OPs 600, 602, respectively, when determining one of the class AB OPs 600, 602 is operated in the dynamic operating status, and controls low bias currents IBL4, IBL5 as the bias currents of the class AB OPs 600, 602, respectively, when determining both of the class AB OPs 600, 602 is operated in the quiescent operating status. A detailed circuitry schematic diagram of the comparing and selecting unit 606 is shown in FIG. 6B, wherein operations can be understood by referring to operations of the comparing and selecting unit 204 shown in FIG. 3. Noticeably, elements and signals shown in FIG. 6A and FIG. 6B having similar structures and operations as in the above description are denoted by the same symbols. Moreover, an amount of class AB OPs of the class AB OP system 60 is not limited to two; the spirit of the present invention is to control bias currents of other class AB OPs according to an output voltage of one class AB OP. All modifications or alterations derived from the concept should belong to the scope of the present invention.

Figure 7:
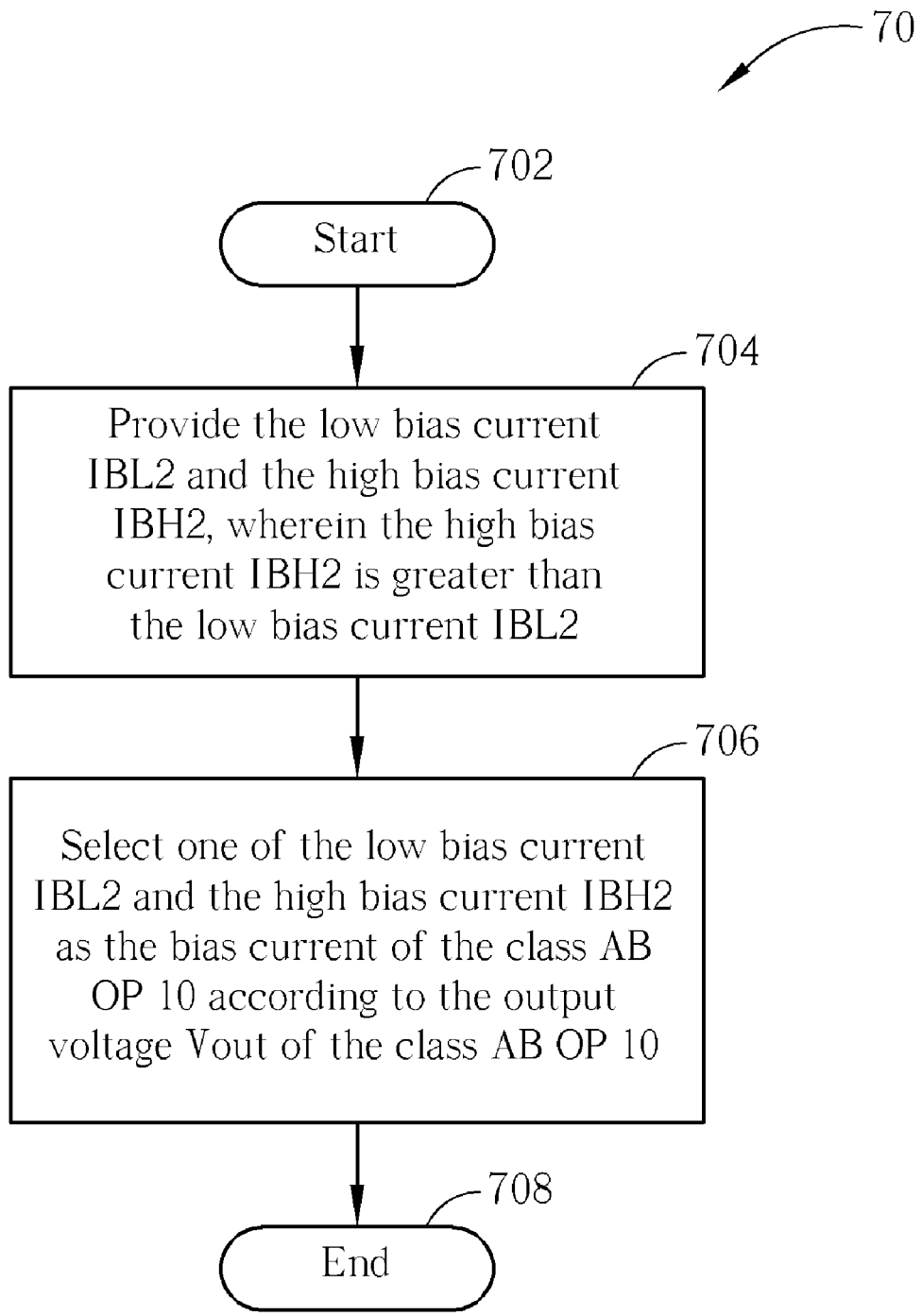
FIG. 7 is a schematic diagram of a current control process according to an embodiment of the present invention.

Operations of the current control circuit 20 can be summarized into a current control process 70 as shown in FIG. 7. The current control process 70 includes the following steps:

Step 702: Start.

Step 704: Provide the low bias current IBL2 and the high bias current IBH2, wherein the high bias current IBH2 is greater than the low bias current IBL2.

Step 706: Select one of the low bias current IBL2 and the high bias current IBH2 as the bias current of the class AB OP 10 according to the output voltage Vout of the class AB OP 10.

Step 708: End.

The current control process 70 can be understood by referring to the above description, and is therefore not detailed hereinafter.

The conventional class AB OP 10 applies the fixed bias current IB2. Therefore, if a lower bias current IB2 is applied, the efficiency of the class AB OP 10 in a dynamic operating status is reduced; and if a higher bias current IB2 is applied, the power consumption of the class AB OP 10 in the quiescent operating status is increased. In comparison, the current control circuit 20 of the present invention can control the class AB OP 10 to apply the higher high bias current IBH2 in the dynamic operating status, so as to enhance efficiency and reduce nonlinear distortion, and apply the lower low bias current IBL2 in the quiescent operating status, so as to reduce power consumption.

Those skilled in the art will readily observe that numerous modifications and alterations of the device and method may be made while retaining the teachings of the invention.

What is claimed is:

1. A current control circuit for controlling a bias current of a class AB operational amplifier (OP), comprising:
    a low bias current source, for generating a low bias current;
    a high bias current source, for generating a high bias current greater than the low bias current; and
    a comparing and selecting unit, coupled to an output terminal of the class AB OP, for selecting one of the low bias current and the high bias current to output as the bias current according to an output voltage of the class AB OP;
    wherein the comparing and selecting unit selects the low bias current to output as the bias current if an absolute value of a voltage difference between the output voltage and a quiescent voltage is less than a specific value, and selects the high bias current to output as the bias current if the absolute value of the voltage difference between the output voltage and the quiescent voltage is greater than the specific value.

2. The current control circuit of claim 1, wherein the quiescent voltage is equal to a voltage level of the output voltage of the class AB OP when no signal is inputted into the class AB OP.

3. The current control circuit of claim 1, wherein the comparing and selecting unit further comprises:
    a positive comparator, for receiving the output voltage and the quiescent voltage at a positive input terminal and a negative input terminal, respectively, to generate a positive comparing result according to the specific value and a value of the output voltage minus the quiescent voltage;
    a negative comparator, for receiving the quiescent voltage and the output voltage at a positive input terminal and a negative input terminal, respectively, to generate a negative comparing result according to the specific value and a value of the quiescent voltage minus the output voltage;
    an OR gate, coupled to the positive comparator and the negative comparator, for generating a high bias current signal according to the positive comparing result and the negative comparing result; and
    an inverter, coupled to the OR gate, for generating a low bias current signal according to the high bias current signal.

4. The current control circuit of claim 3, wherein the high bias current signal controls the high bias current as the bias current if the positive comparing result indicates the value of the output voltage minus the quiescent voltage is greater than the specific value or the negative comparing result indicates the value of the quiescent voltage minus the output voltage is greater than the specific value.

5. The current control circuit of claim 3, wherein the low bias current signal controls the low bias current as the bias current if the positive comparing result indicates the value of the output voltage minus the quiescent voltage is less than the specific value and the value of the quiescent voltage minus the output voltage is less than the specific value.

6. A current control method for controlling a bias current of a class AB operational amplifier (OP), comprising:
    providing a low bias current and a high bias current, wherein the high bias current is greater than the low bias current;
    selecting one of the low bias current and the high bias current to output as the bias current according to an output voltage of the class AB OP;
    wherein the low bias current is selected to output as the bias current if an absolute value of a voltage difference between an output voltage and a quiescent voltage is less than a specific value, and the high bias current is selected to output as the bias current if the absolute value of the voltage difference between the output voltage and the quiescent voltage is greater than the specific value.

7. The current control method of claim 6, wherein the quiescent voltage is equal to a voltage level of the output voltage of the class AB OP when no signal is inputted into the class AB OP.

8. The current control method of claim 6 further comprising:
   generating a positive comparing result according to the specific value and a value of the output voltage minus the quiescent voltage;
   generating a negative comparing result according to the specific value and a value of the quiescent voltage minus the output voltage;
   generating a high bias current signal according to the positive comparing result and the negative comparing result; and
   generating a low bias current signal according to the high bias current signal.

9. The current control method of claim 8, wherein the high bias current signal controls the high bias current as the bias current if the positive comparing result indicates the value of the output voltage minus the quiescent voltage is greater than the specific value or the negative comparing result indicates the value of the quiescent voltage minus the output voltage is greater than the specific value.

10. The current control method of claim 8, wherein the low bias current signal controls the low bias current as the bias current if the positive comparing result indicates the value of the output voltage minus the quiescent voltage less than the specific value and the value of the quiescent voltage minus the output voltage is less than the specific value.

* * * * *